(12) United States Patent
Mendoza

(10) Patent No.: US 6,881,530 B1
(45) Date of Patent: Apr. 19, 2005

(54) THIN FILM SOL-GEL DERIVED GLASS

(75) Inventor: Edgar A. Mendoza, Redondo Beach, CA (US)

(73) Assignee: Optinetrics, Inc., Torrance, CA (US)

( * ) Notice: Subject to any disclaimer, the term of this patent is extended or adjusted under 35 U.S.C. 154(b) by 0 days.

(21) Appl. No.: 09/574,841

(22) Filed: May 19, 2000

(51) Int. Cl.$^7$ .............................. G03F 7/00; G03F 7/004
(52) U.S. Cl. ..................... 430/270.1; 430/321; 430/322
(58) Field of Search ............................. 430/270.1, 321, 430/322

(56) References Cited

U.S. PATENT DOCUMENTS

| | | | |
|---|---|---|---|
| 4,725,110 A | 2/1988 | Glenn et al. | 350/3.61 |
| 5,080,503 A | 1/1992 | Najafi et al. | 385/1 |
| 5,080,962 A | 1/1992 | Hench | 428/218 |
| 5,151,958 A | 9/1992 | Honkanen | 385/50 |
| 5,265,185 A | 11/1993 | Ashley | 385/132 |
| 5,360,834 A * | 11/1994 | Popall et al. | 522/36 |
| 5,574,807 A | 11/1996 | Snitzer | 385/24 |
| 5,585,640 A * | 12/1996 | Huston et al. | 250/483.1 |
| 5,620,495 A | 4/1997 | Aspell et al. | 65/392 |
| 6,054,253 A | 4/2000 | Fardad et al. | 430/32 |
| 6,103,363 A * | 8/2000 | Boire et al. | 428/325 |
| 6,115,518 A | 9/2000 | Clapp | 385/37 |
| 6,158,245 A | 12/2000 | Savant | 65/17.2 |
| 6,268,089 B1 * | 7/2001 | Chandross et al. | 430/1 |

FOREIGN PATENT DOCUMENTS

| | | | |
|---|---|---|---|
| CA | 2218273 | 4/1999 | G02B/6/136 |
| WO | WO 99/06873 | 2/1999 | C03B/32/00 |

OTHER PUBLICATIONS

Mendoza E.A., Ferrell D.J., Syracuse S.J., Khalil A.N., Lieberman R.A., "Photolithography of Integrated Optice Devices in Sol–Gel Glasses," Proc. SPIE–Int. Soc. Opt. Eng., vol. 2288, pp. 580–588 (1999).

Najafi, S.I., Touam T., Sara R., Andrews M.P., Fardad M.A., "Sol–Gel Glass Waveguide and Grating on Silicon," Journal of Lightwave Technology, vol. 16, No. 9 (1998).

McEntee J. "Sol–Gel Devices 'will meet cost targets of fibre to the home'," Opto & Laser Europe, Issue 31, p. 5 (1996).

Coudray, P., Chisham, J., Malek–Tabrizi, A., Li, C.–Y., Andrews, M.P., Peyghambarian, N., Najafi, S.I., "Ultraviolet Light Imprinted Sol–Gel Silica Glass Waveguide Devices on Silicon," Optics Comm., 128(1–3) 19–22 (1996).

Coudray, P., Chisham, J., Andrews, M.P., Najafi, S.I., "Ultra-violet Light Imprinted Sol–Gel Silica Glass Low–Loss Waveguides for Use at 1.55 $\mu$m," Opt. Eng. 36(4) 1234–1240 (1997).

Fardad, A., Andrews, M., Milova, G., Malek–Tabrizi A., Najafi, I., "Fabrication of Ridge Waveguides:: A New Solgel Route," Applied Optics, vol. 37, No. 12, pp. 2429–2434 (1998).

Najafi, S.I., Armenise, M.N., "Organoaluminophosphate sol-gel silica glass thin films for integrated optics," Proc. SPIE–Int. Soc. Opt. Eng., vol. 2997 pp. 79–84 (1997).

Cindrich I., Lee, S.H., Sutherland, R. L., "Adapting Existing E–Beam Writers to Write HEBS–Glass Gray Scale Masks," Proc. SPIE–Int. Soc. Opt. Eng., vol. 3633 pp. 35–45 (1999).

Kley, E–B., "Continuous Profile Writing by Electron and Optical Lithography," Microelectronic Engineering, 34 pp. 261–298 (1997).

(Continued)

*Primary Examiner*—Amanda Walke
(74) *Attorney, Agent, or Firm*—Jones Day

(57) ABSTRACT

Thermally-assisted organometallic sol-gel derived glasses have been found to permit fabrication of thin films sufficiently thin for telecom components. Inclusion of a photosensitizer in the film permits light of controlled intensity to modify refractive indices in the film to form useful structures.

14 Claims, 2 Drawing Sheets

OTHER PUBLICATIONS

Syms, R.R.A., "Silica–On Silicon Integated Optics," Advances in Integrated Optics, pp. 121–150 (1994).

Najafi, S.I., Andrews, M.P., Fardad, M.A., Milova, G., Tahar, T., Coudray, P., "UV–Light Imprinted Surface, Ridge and Buried Sol–Gel Glass Waveguides and Devices on Silicon," Proc. SPIE–Int. Soc. Opt. Eng., vol. 2954 pp. 100–104 (1996).

Holmes, A.S., Syms, R.R.A., "Fabrication of Low–Loss Channel Waveguides in Sol–Gel Glass on Silicon Substrates," Advanced Materials in Optics, Electro–Optics and Communication Technologies (1995).

Holmes, A.S., Syms, R.R.A., Li, M., Green M., "Fabrication of Buried Channel Waveguides on Silicon Substrates Using Spin–On Glass," Applied Optics, vol. 32, No. 25 pp. 4916–4921 (1993).

Kawachi, M., "Silica Waveguides on Silicon and Their Application to Integrated–Optic Components," Optical and Quantum Electronics, vol. 22, No. 5, pp. 391–416 (1990).

Ballato, J., Dejneka, M., Riman,R.E., Snitzer, E., Zhou, W., "Sol–Gel Synthesis of Rare–Earth–Doped Fluoride Glass Thin Films," Journal of Materials Research, vol. 11, No. 4., pp. 841–849 (1996).

Yang, L., Saavedra, S.S., Armstrong, N.R., Hayes, J., "Fabrication and Characterization of Low–Loss, Sol–Gel Planar Waveguides," Anal. Chem. vol. 66, No. 8, pp. 1254–1263 (1994).

Schmidt, H., "Thin Films, the Chemical Processing up to Gelation," Structure and Bonding, vol. 77, pp. 119–151 (1992).

Chisham, J.E., Andrews, M.P., Li, C.-Y., Najafi, S.I., Makek–Tabrizi, A., "Gratings Fabrication by Ultraviolet Light Imprinting and Embossing in a Sol–Gel Silica Glass," Proc. SPIE–Int. Soc. Opt. Eng., vol. 2695, pp. 52–56 (1996).

Svalgaard, M., Poulsen, C.V., Bjarklev A., Poulsen, O., "Direct UV Writing of Buried Singlemode Channel Waveguides in Ge–Doped Silica Films," Electronic Letters, vol. 30, No. 17, pp. 1401–1403 (1994).

Andrews, M.P., Kanigan T., Najafi, S.I., "Auto–Embossed Bragg Gratings From Self–Organizing Polymers: Chemical Tuning of Periodicity and Photoinduced Anisotropy," Proc. SPIE–Int. Soc. Opt. Eng., vol. 2695, pp. 4–15 (1996).

Najafi, S. I., Li, C.–Y., Chisham, J., Andrews, M.P., Coudray, P., Malek–Tabrizi, A., Peyghambarian, N., "Ultraviolet Light Imprinted Sol–Gel Silica Glass Channel Waveguides on Silicon," Proc. SPIE–Int. Soc. Opt. Eng., vol. 2695, pp. 38–41 (1996).

Brinker, C.J., Scherer, G.W., "The Physics and Chemistry of Sol–Gel Processing," Sol–Gel Science, Academic Press, Inc. pp. 864–1879.

Li, C.–Y., Chisham, J., Andrews, M., Najafi, S.I., Mackenzie, J.D., Peyghambarian, N., "Sol–Gel Integrated Optical Coupler by Ultraviolet Light Imprinting," Electronic Letters, vol. 31, No. 4, pp. 271–272 (1995).

Andrews, M.P., "An Overview of Sol Gel Guest–Host Materials Chemistry for Optical Devices," Proc. SPIE–Int. Soc. Opt. Eng., vol. 2997, pp. 48–59 (1997).

Rösch, O.S., Bernard, W., Müller–Fiedler, R., Dannberg, P., Bräuer, A., R. Buestrich, R., Popall, M., "High Performance Low Cost Fabrication Method for Integrated Polymer Optical Devices," Proc. SPIE–Int. Soc. Opt. Eng., vol. 3799, pp. 214–224.

Roscher, C., Buestrich R., Dannberg, P., Rösch, O., Popall, M., "New Inorganic–Organic Hybrid Polymers for Integrated Optics," Mat. Res. Soc. Symp. Proc. vol. 519, pp. 239–244 (1998).

Mendoza, E.A., "Photolithography of Integrated Optic Devices in Porous Glasses," UMI Dissertation Services (1992).

Mendoza, A., Wolkow, E., Sunil, D., Wong, P., Sokolow, J., Rafailovich, M., den Boer, M., Gafney, H., "A Comparison of Iron Oxides Photodeposited in Porous Vycor Glass and Tetramethoxysilane/Methanol/Water Xerogels," Langmuir, vol. 7, No. 12, pp. 993–4009 (1991).

Che, T., Soskey, P., Banash, M., Caldwell, M., McCallum, I., Mininni, R., Warden, V., "Optimization of a Gel Derived Gradient Index Material," Proc. SPIE–Int. Soc. Opt. Eng., vol. 1758, pp. 193–204 (1992).

Gafney, H., "A Photochemical Approach to Integrated Optics," J. Macromol. Sci.–Chem. vol. A27(9–11), pp. 1187–1202 (1990).

Simmons, K., Stegeman, G., Potter, B., Simmons, J., "Photosensitivity of Solgel–Derived Germanoscilicate Planar Waveguides," Optics Letters, vol. 18, No. 1, pp. 25–27 (1993).

Mendoza, E., Gafney, H., "Photolithography of Integrated Optic Devices in Porous Glasses," Nonlinear Optical Materials, CRC Press, eds. Kuhn, H., Robillard, J., Part V, pp. 178–191 (1992).

Mendoza, E., Gafney, H., "Photolithography Imaging of Planar Optical Waveguides and Integrated Optic Devices Onto Porous Silicate Glasses and Silica Sol–Gels," Mat. Res. Soc. Symp. Proc., vol. 244, pp. 343–350 (1992).

Mendoza, E., Gafney, H., Morse, David, "Photolithographic Processing of Integrated Optic Devices in Glasses," SPIE vol. 1583 Integrated Optical Circuits, pp. 43–51 (1991).

Mendoza, E., Gafney, H., Morse, D., "The Photochemical Generation of Gradient Indices in Glass," SPIE vol. 1378 Optically Activated Switching, pp. 139–144 (1990).

Wolkow, E., Gafney, H., Wong, P., Hanson, A., "Highly Resolved Gradient Patterns in Glass by Means of Chemical Vapor Deposition," Mat. Res. Soc. Symp. Proc. vol. 168, pp. 381–393 (1990).

Mendoza, E., Ferrell, D., Lieberman, R., "Photolithography of Bragg Gratings in Sol–Gel Derived Fibers," SPIE vol. 2288 Sol–Gel Optics III, pp. 621–629 (1994).

* cited by examiner

THIN FILM SOL-GEL DERIVED GLASS

REFERENCE TO RELATED APPLICATIONS

This application is related to a companion application Ser. No. 09/574,840 (IOS-118), filed on even date herewith and assigned to the assignee of the present application.

FIELD OF THE INVENTION

This invention relates to a process for producing photosensitive thin films of sol-gel derived glass and to such films of a thickness useful for integrated optic devices produced thereby.

BACKGROUND OF THE INVENTION

The doctoral thesis by the applicant herein entitled "Photolithography of Integrated Optic Devices in Porous Glass, City University of New York, 1992 describes an organometallic system of inclusions in a thermally-assisted, porous glass bulk material. The process for fabricating the glass requires introduction of a photosensitizer, exposure to light through a mask and two heat treatments. The doctoral thesis states that sol-gel techniques can be used to make the porous glass bulk material.

BRIEF DESCRIPTION OF THE INVENTION

The invention is based on the realization that the porous glass techniques for bulk materials using thermally assisted, organometallic, sol-gel derived glass can be extended to thin films suitable for telecom components and virtually free of lateral shrinkage. Consequently, a variety of highly desirable integrated optic components can be made by such a technique. Specifically, a technique for the photolithographic fabrication of integrated optic structures in thin films of photosensitive sol-gel glasses is described here. This technique involves the formation of a photosensitive sol-gel thin film including an organometallic photosensitizer, on a suitable substrate (glass, silicon, or any other support material). Next, the photosensitive film is exposed to white or ultraviolet light inducing a photochemical reaction in the photosensitive sol-gel glass network with the end photo-product being a metal oxide. The photodeposited metal oxide is permanently bound to the sol-gel film glass network as a glass modifier during a heat treatment process, which in turn induces a permanent refractive index increase in the glass. The refractive index increase is dependent on the concentration of the photosensitizer and on the light energy used in the exposure process. Therefore, a spatially varying light intensity during exposure results in a spatially varying refractive index profile. This refractive index profile induced in the film can be designed to guide light.

Exposure of the photosensitive sol-gel film to white or ultraviolet light induces the unbinding of the metal from the photolabile moiety component of the photosensitizer followed by the binding of the metal to the sol-gel film. The exposed regions of the sol-gel film are converted to a metal oxide silica film by first and second step heatings at a low temperature and high temperature, respectively. The low temperature drives out the unexposed (unbound) photosensitizer and the unbound photolabile moiety. The higher temperature step unbinds the organic component from the bound photosensitizer and drives it off. This step also permanently binds the metal to the silica film forming a metal oxide glass modifier. If the sol-gel film is deposited on a glass or silicon substrate, a metal oxide doped silica region of Si—O—M—O—Si formed in the exposed regions acting as a glass modifier which in turn modifies the refractive index. The unexposed photosensitizer is driven off during the heat treatment steps. Since no material is removed from the sol-gel film in this process, as in the case of prior-art processes, the resulting top surface is planar, thus leading to a simpler process for producing devices and for achieving increased lifetime of resulting devices.

DETAILED DESCRIPTION OF THE INVENTION

Figure 1:
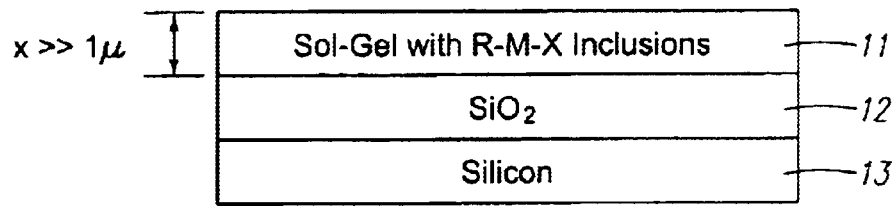
FIGS. 1, 2, 4 and 5 are schematic side views of thin films in accordance with the principles of this invention.

FIG. 1 is a side view of film 11 of a sol-gel film with R-M-X constituents dissolved therein. The film is shown formed (usually by a well known spinning technique) on the $SiO_2$ surface layer 12 on a silicon substrate 13. The R constituents are taken from a class of volatile organic materials consisting of $CH_3$, $CH_3$—$CH_2$, $CH_3$—$CH_2$—$CH_2$, the M constituents (metals) are taken from the class of metals consisting of group metals Ge, Sni and Pb, Group VIB including Se and Te, Group VIIIA including Fe, Co, Ni, and Group IVA including Ti and Zr and rare earth metals, and the X constituents (photolabile moiety) are taken from the class consisting of chlorine, iodine, fluorine, bromine, and carbonyls.

Figure 2:
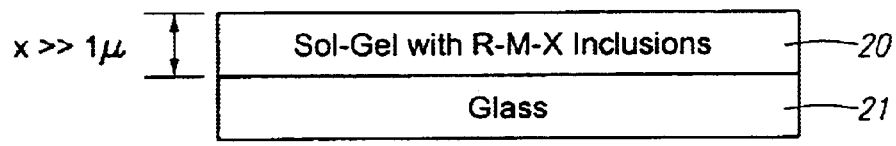

FIG. 2 shows an alternate embodiment where the sol-gel film 20 is formed on a glass substrate 21. FIGS. 1 and 2 represent the initial sol-gel solution formed on appropriate substrates of silicon (FIG. 1) and glass (FIG. 2). The process of forming the sol-gel solution into useful film structures is discussed in connection with FIG. 3.

Figure 3:
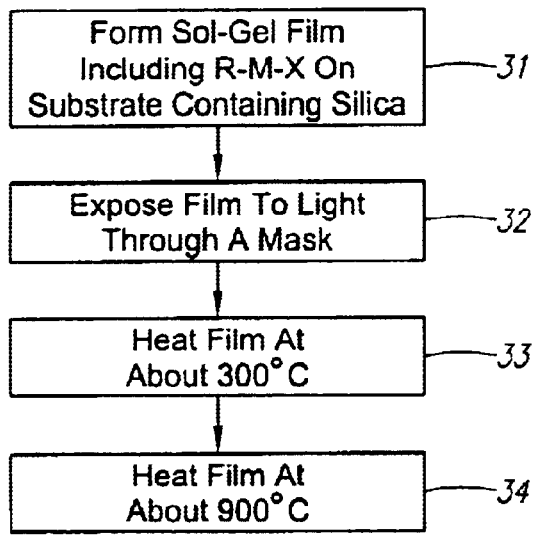
FIG. 3 is a block diagram of the steps for fabricating a structured thin film in accordance with this invention.

Specifically, FIG. 3 is a block diagram of the process for fabricating structured films from the sol-gel solution of FIGS. 1 and 2. Block 31 of FIG. 3 represents the step of forming a sol-gel film with inclusions of R-M-X on a suitable substrate (as shown in FIG. 1 or FIG. 2). Block 32 represents the exposure of the film through a mask to light in a range of wavelengths from ultraviolet (UV) through the visible range. This step unbinds the photolabile moiety (X) and binds the metal (M) to the silicon oxide.

Block 33 of FIG. 3 represents the step of heating the film to about 300 degrees C. for a time to bind the metal permanently to the $SiO_2$. This step also drives off the unexposed oranometallic photosensitizer from the entire sol-gel layer and the unbound photolabile moeity (X) from the exposed portions of the sol-gel layer. Block 34 of FIG. 3 represents the final heating step to about 900 degrees C. for unbinding the organic component (R) from the bound photosensitizer and driving off that component. This step also permanently binds the metal to the silica sol-gel film forming a metal oxide glass modifier.

Figure 4:
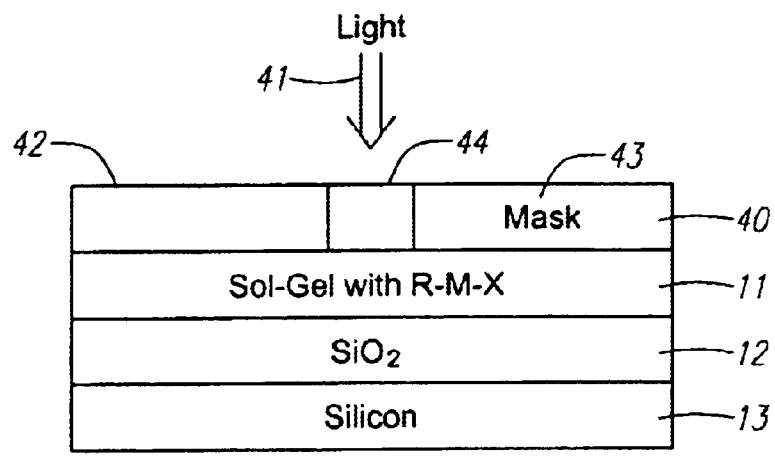

FIG. 4 shows the structure of FIG. 1 with a mask 40 in place. Mask 40 is opaque to the incident light (arrow 41) in regions 42 and 43 and is transparent to light in region 44. The result of exposure to light is a structured film (in excess of 1 micron) where the exposed region of the film includes Si—O—M—O—Si and the unexposed regions include $SiO_2$.

Figure 5:
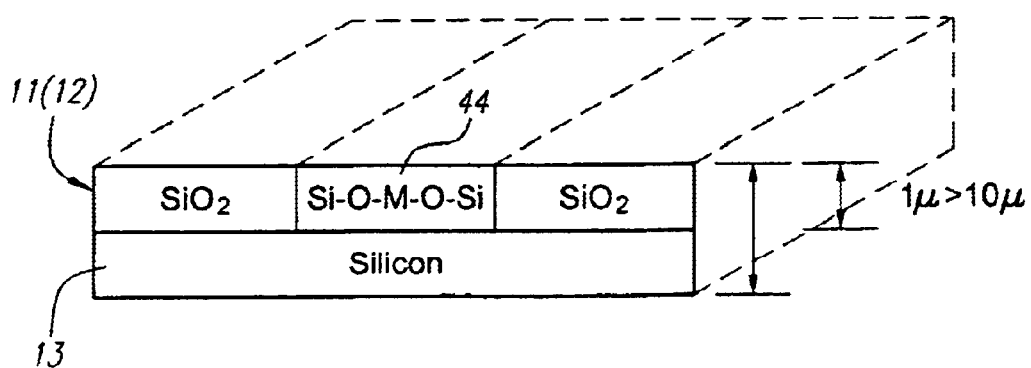

The concentration of photodeposited metal oxide determines the index of refraction of the exposed region which can be made relatively high compared to that of adjacent regions. If we visualize region 44 extending away from the viewer as indicated by the broken lines in FIG. 5, the resulting structure can be seen to represent a waveguide with the "core" being buried as indicated.

In one specific embodiment, a sol-gel film 1–10 microns thick was formed on a silicon substrate 1 cm×0.5 cm×0.1 cm thick with a $SiO_2$ surface layer <2 microns thick thereon. The sol-gel film included Sn (M) 2%, I (X) 2%, and $(CH_3)_3$ (R) 2%. Region 44 has a width of 10 microns, exposed to light with a wavelength of 254 nm for 30 minutes. The exposed region had an index of refraction of 1.55 and the unexposed regions had indices of refraction of 1.45. The film has a thickness of 1–10 microns after processing and has unchanged lateral dimensions.

In another embodiment, a sol-gel film 1–10 microns thick was formed on a glass substrate 1 cm×0.5 cm×0.1 cm thick. The sol-gel film included Ti (M) 2%, Cl (X) 4%, and Cp (R) 4% where Cp is cyclopentadienyl. Region 44 has a width of 10 microns, exposed to light with a wavelength of 514 nm for 120 minutes. The exposed region had an index of refraction of 1.75 and the unexposed region had indices of refraction of 1.45. The film had an final thickness of 1–10 microns with the lateral dimensions thereof being unchanged.

What is claimed is:

1. A glass thin film derived from a thin film of photosensitive sol-gel doped with an organometallic photosensitizer, said organometallic photosenitizer having a formula R-M-X, where X is a photolabile moiety, M is a metal, and R is a volatile organic compound, wherein said thin film of photosensitive sol-gel has a thickness in excess of one micron, is exposed to light in at least one region to unbind X constituents from M constituents of said photosensitizer within said at least one region and to bind the resulting M constituents to the sol-gel, and is heat treated to drive off the unexposed photosensitizer and unbound X constituents and to permanently bind the M constituents to a sol-gel derived glass matrix and thereby form said glass thin film, and wherein said heat treatment is carried out in a manner that does not cause lateral shrinkage or cracking of said glass thin film.

2. A thin film as in claim 1, said film being formed on a substrate having a surface including silicon and oxygen.

3. A thin film as in claim 2 wherein said surface comprises $SiO_2$ and is a silica enriched thin layer on a silicon substrate.

4. A thin film as in claim 1, said film being formed on a glass substrate.

5. A thin film as in claim 1, wherein R is taken from a class of low-volatile organic molecules consisting of $CH_3$, $CH_3$—$CH_2$, $CH_3$—$CH_2$— and $CH_2$, and Cp, M is a metal taken from a class consisting of metals in Groups IVA, IVB, and VIB, transition metals and rare earth metals, and X is a photolabile moiety taken from a class consisting of halogens and carbonyls.

6. A thin film as in claim 3 where R comprises $CH_3$, M comprises Sn, and X comprises I.

7. A thin film as in claim 3 wherein R comprises cyclopentadienyl.

8. A thin film as in claim 3 wherein M comprises Ti.

9. A thin film as in claim 3 wherein X comprises Cl.

10. A thin film as in claim 4 wherein R comprises $CH_3$.

11. A thin film as in claim 4 wherein M comprises Pb.

12. A thin film as in claim 4 wherein X comprises Cl.

13. A thin film as in claim 2 including thereon a mask opaque to light in the UV and visible ranges.

14. A thin film of sol-gel derived glass on a silica substrate, said film including at least one metal oxide doped silica region of Si—O—M—O—Si with adjacent regions of $SiO_2$, where M is a metal, said film having a thickness substantially in excess of one micron and being free of cracks and lateral shrinkage, and wherein said metal oxide is photodeposited from an organometallic photosensitizer included in the sol-gel used to form said film.

* * * * *

UNITED STATES PATENT AND TRADEMARK OFFICE
CERTIFICATE OF CORRECTION

PATENT NO. : 6,881,530 B1
DATED : April 19, 2005
INVENTOR(S) : Edgar A. Mendoza

It is certified that error appears in the above-identified patent and that said Letters Patent is hereby corrected as shown below:

Column 2,
Line 25, change "metals consisting of group metals Ge, Sni and Pb, Group" to read -- metals consisting of group IVB metals Ge, Sn and Pb, Group --.

Column 4,
Line 13, change "$CH_3$-$CH_2$- and $CH_2$" to read -- $CH_3$-$CH_2$-$CH_2$ --.

Signed and Sealed this

Thirteenth Day of September, 2005

JON W. DUDAS
*Director of the United States Patent and Trademark Office*